United States Patent
Kwak

(10) Patent No.: US 7,919,920 B2
(45) Date of Patent: Apr. 5, 2011

(54) ORGANIC LIGHT-EMITTING DISPLAY DEVICE AND METHOD FOR FABRICATING THE SAME

(75) Inventor: Won Kyu Kwak, Gyeonggi-do (KR)

(73) Assignee: Samsung Mobile Display Co., Ltd. (KR)

( * ) Notice: Subject to any disclaimer, the term of this patent is extended or adjusted under 35 U.S.C. 154(b) by 322 days.

(21) Appl. No.: 11/644,593

(22) Filed: Dec. 22, 2006

(65) Prior Publication Data

US 2007/0176554 A1    Aug. 2, 2007

(30) Foreign Application Priority Data

Jan. 27, 2006  (KR) .................... 10-2006-0008762

(51) Int. Cl.
*H01L 27/02* (2006.01)
*H01L 27/12* (2006.01)

(52) U.S. Cl. ............ 313/512; 313/498; 257/79; 257/81; 257/98

(58) Field of Classification Search .................. 313/512, 313/498; 257/79, 81, 98
See application file for complete search history.

(56) References Cited

U.S. PATENT DOCUMENTS

| | | | | |
|---|---|---|---|---|
| 5,814,434 A * | 9/1998 | Nakamura et al. | ............... | 430/25 |
| 5,949,184 A * | 9/1999 | Ohoshi et al. | ............... | 313/485 |
| 2004/0069017 A1 | 4/2004 | Li | | |
| 2004/0207314 A1 * | 10/2004 | Aitken et al. | ............... | 313/504 |
| 2004/0245529 A1 * | 12/2004 | Yamazaki et al. | ............... | 257/79 |
| 2005/0093767 A1 * | 5/2005 | Lu et al. | ............... | 345/1.1 |
| 2005/0151151 A1 * | 7/2005 | Hawtof et al. | ............... | 257/100 |
| 2006/0279205 A1 * | 12/2006 | Li et al. | ............... | 313/506 |
| 2007/0126355 A1 * | 6/2007 | Chiu et al. | ............... | 313/512 |

FOREIGN PATENT DOCUMENTS

| | | |
|---|---|---|
| CN | 1582072 A | 2/2005 |
| EP | 1605530 A2 | 12/2005 |
| EP | 1605530 A2 * | 12/2005 |
| JP | 63-213245 | 9/1988 |
| JP | 03-201389 | 9/1991 |

(Continued)

OTHER PUBLICATIONS

European Search Report dated Aug. 2, 2007 for Application No. EP 07101241.3-1235, 9 pages.

(Continued)

*Primary Examiner* — Bumsuk Won
*Assistant Examiner* — Nathaniel J Lee
(74) *Attorney, Agent, or Firm* — Knobbe Martens Olson & Bear LLP

(57) ABSTRACT

Disclosed is an organic light-emitting display device capable of blocking the infiltration of oxygen and moisture and effectively preventing light leakage. The device includes a first substrate with first and second pixel regions wherein a plurality of organic light-emitting diodes are formed. The device further includes a non-pixel region around the first and the second pixel-regions, a second substrate disposed on the upper part of the first substrate to be overlapped with the first and the second pixel regions and a part of the non-pixel region, and a frit provided between the first and the second substrates to be overlapped with at least one of the first and the second pixel regions and at least a part of the non-pixel region. The first and the second substrates are adhered to each other by the fit in the part corresponding to the non-pixel region.

23 Claims, 6 Drawing Sheets

FOREIGN PATENT DOCUMENTS

| | | |
|---|---|---|
| JP | 2000-347394 | 12/2000 |
| JP | 2003345271 | 12/2003 |
| JP | 2004-006254 | 1/2004 |
| JP | 2005-520193 | 7/2005 |
| JP | 2005-338769 | 12/2005 |
| WO | WO 2004-095597 A2 | 11/2004 |

OTHER PUBLICATIONS

Japanese Office Action issued Feb. 16, 2010 in corresponding Japanese Patent Application No. 2006-199919.

* cited by examiner

ORGANIC LIGHT-EMITTING DISPLAY DEVICE AND METHOD FOR FABRICATING THE SAME

CROSS-REFERENCE TO RELATED APPLICATIONS

This application claims the benefit of Korean Patent Application No. 2006-0008762, filed on Jan. 27, 2006, in the Korean Intellectual Property Office, the disclosure of which is incorporated herein by reference.

BACKGROUND OF THE INVENTION

1. Field of the Invention

The present invention relates to an organic light-emitting display device and method for fabricating the same. More particularly, the invention relates to an organic light-emitting display device and method for fabricating the same, capable of blocking the infiltration of oxygen and moisture, etc. by encapsulating a first and a second substrates with a frit, simplifying the process and effectively preventing light leakage.

2. Description of the Related Art

An organic light-emitting display device is one sort of a flat display devices wherein an organic light-emitting layer is positioned between electrodes opposed to each other and voltage is then applied between the electrodes so that holes and electrons injected from the respective electrodes to the organic light-emitting layer are coupled, and the exciting molecules thus generated are returned to a base state, thereby emitting energy as light.

The organic light-emitting display device is excellent in terms of light-emitting efficiency, brightness, viewing angle and response speed and can be fabricated to be light weight and thin and therefore, has been spotlighted as a next generation display.

The organic light-emitting display device can include a pair of substrates joined together by a material, e.g., a glass frit, which seals the substrates together to protect the materials from exposure to moisture and/or other contaminants. One of the substrates may be a transparent substrate through which the organic light-emitting display device can be viewed while the other may be non-transparent, preferably comprising a black matrix to prevent light leakage from interfering with the light emitted by the pixels.

The frit can comprise a black absorbing tint in order and block light and function as a black matrix, BM, thereby preventing light leakage. Light leakage is a phenomenon due to the reflection of light generated external to the display region, such as light scattered toward the back substrate and transmitting through the back substrate, or light generated from a second display region and reflecting off the back substrate. Image quality can be deteriorated when light leakage is generated. However, the frit is typically applied to only the outer edge of the display region to be encapsulated, that is, the part on which an organic light-emitting pixel element is not formed. Thus, the frit is ineffective in functioning as a black matrix to block light coming from regions outside of the display region, such as, transmitting from behind the back substrate or reflecting from a second display region off of the back substrate. That is, since the light leakage generated from outside of the pixel region is not effectively blocked, a light shielding film covering the back substrate is typically formed or the back substrate in order to prevent light from the second pixel region from reflecting off the second substrate. Thereby, the light leakage is not effectively prevented, causing problems that the fabricating process is complicated and the process time is extended.

Therefore, a method of blocking an infiltration of oxygen and moisture into the space between the two substrates by encapsulating the two substrates with the frit, while simplifying the process and effectively preventing light leakage is needed.

SUMMARY OF THE INVENTION

An aspect of the invention provides an organic light-emitting device. The device includes a first substrate, a second substrate comprising an inner surface facing the first substrate, the inner surface comprising a first portion and a second portion, a first array of light-emitting pixels interposed between the first substrate and the second substrate, a second array of light-emitting pixels interposed between the first substrate and the second substrate, a frit layer formed over the first portion of the inner surface while not formed over the second portion of the inner surface, wherein the first portion generally opposes the first array, and wherein the second portion generally opposes the second array, and a frit seal interconnecting the first and second substrates while surrounding the first array and the second array such that the frit seal, the first substrate and the second substrate form an enclosed space where the first array and the second array are located.

In the above described device, the pixels of the first array may be configured to emit light substantially through the first substrate. The pixels of the second array may be configured to emit light substantially through the second substrate. The first portion of the inner surface may oppose the entire first array. A portion of the frit seal may be adhered to the first substrate and the second substrate. The frit may comprise a glass material, and at least one of a filler material to adjust absorption characteristics, and a filler material to adjust thermal expansion characteristics. The first substrate and the second substrate may be transparent substrates.

Another aspect of the invention provides an organic light-emitting device. This device includes a first substrate, a second substrate comprising an inner surface facing the first substrate, the inner surface comprising a first portion and a second portion, wherein a thickness of the second substrate in an inner portion comprising the first portion and the second portion is thinner than in an outer portion surrounding the inner portion, a first array of light-emitting pixels interposed between the first substrate and the second substrate, a second array of light-emitting pixels interposed between the first substrate and the second substrate, a frit layer formed over the first portion of the inner surface while not formed over the second portion of the inner surface, wherein the first portion generally opposes the first array, and wherein the second portion generally opposes the second array, and a frit seal formed over the outer portion interconnecting the first and second substrates while surrounding the first array and the second array such that the frit seal, the first substrate and the second substrate form an enclosed space where the first array and the second array are located.

In the above described device, the frit layer formed over the first portion of the inner surface and the frit seal formed over the outer portion may be the same thickness. The first portion of the inner surface may oppose the entire first array.

Another aspect of the invention provides a method of making an organic light-emitting device. The method includes providing an unfinished device comprising a first substrate, a first array of organic light emitting pixels, and a second array of light emitting pixels. The method further comprises providing a second substrate, a fit layer and a peripheral frit. In some embodiments, the second substrate comprises a surface comprising a first portion and a second portion, the fit layer being formed over the first portion of the surface while not being formed over the second portion of the surface, the peripheral fit surrounding the first portion and the second portion. The method further comprises placing the second substrate over the unfinished device such that the first array and the second array are interposed between the first substrate, the second substrate and the frit layer. After placing the second substrate, the peripheral frit surrounds the first array and the second array, wherein the first portion generally opposes the first array, and the second portion generally opposes the second array. The method further comprises melting and resolidifying at least part of the peripheral frit so as to interconnect the unfinished device and the second substrate via the peripheral frit.

In the above described method, the peripheral frit may be thicker than the frit layer formed over the first portion. Melting the peripheral frit may include irradiating by laser or infrared rays. The wavelength of the laser or the infrared rays may be in a range from about 800 nm to about 1200 nm. The method may further include masking at least the first portion and the second portion while irradiating. The peripheral frit may be applied to at least one of the first substrate and the second substrate in a form of a paste comprising a glass material and a filler material to adjust absorption characteristics of laser or infrared rays, and the method may further include heating the peripheral frit to a temperature sufficient to cure the frit paste. Heating the frit paste may include irradiating the frit paste with laser or infrared rays. The frit paste may be heated to a temperature in a range from about 300° C. to about 500° C. The first portion of the inner surface may oppose the entire first array.

Another aspect of the invention provides an organic light-emitting device. The device includes a first substrate, a second substrate comprising an inner surface facing the first substrate, the inner surface comprising a first portion and a second portion, light-emitting pixels interposed between the first substrate and the second substrate, a frit layer formed over the first portion of the inner surface while not formed over the second portion of the inner surface, and a frit seal interconnecting the first and second substrates while surrounding the first array and the second array such that the frit seal, the first substrate and the second substrate form an enclosed space where the first array and the second array are located.

In the above described device, the light-emitting pixels may include a first array and a second array. The first array may be configured to emit light through the first substrate. The second array may be configured to emit light through the second substrate. The first portion may generally oppose the first array, and the second portion may generally oppose the second array.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF PREFERRED EMBODIMENTS

Hereinafter, preferred embodiments of the present invention, proposed so that a person having ordinary skill in the art can easily carry out the present invention, will be described in a more detailed manner with reference to the accompanying FIG. 2 to FIG. 6d.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
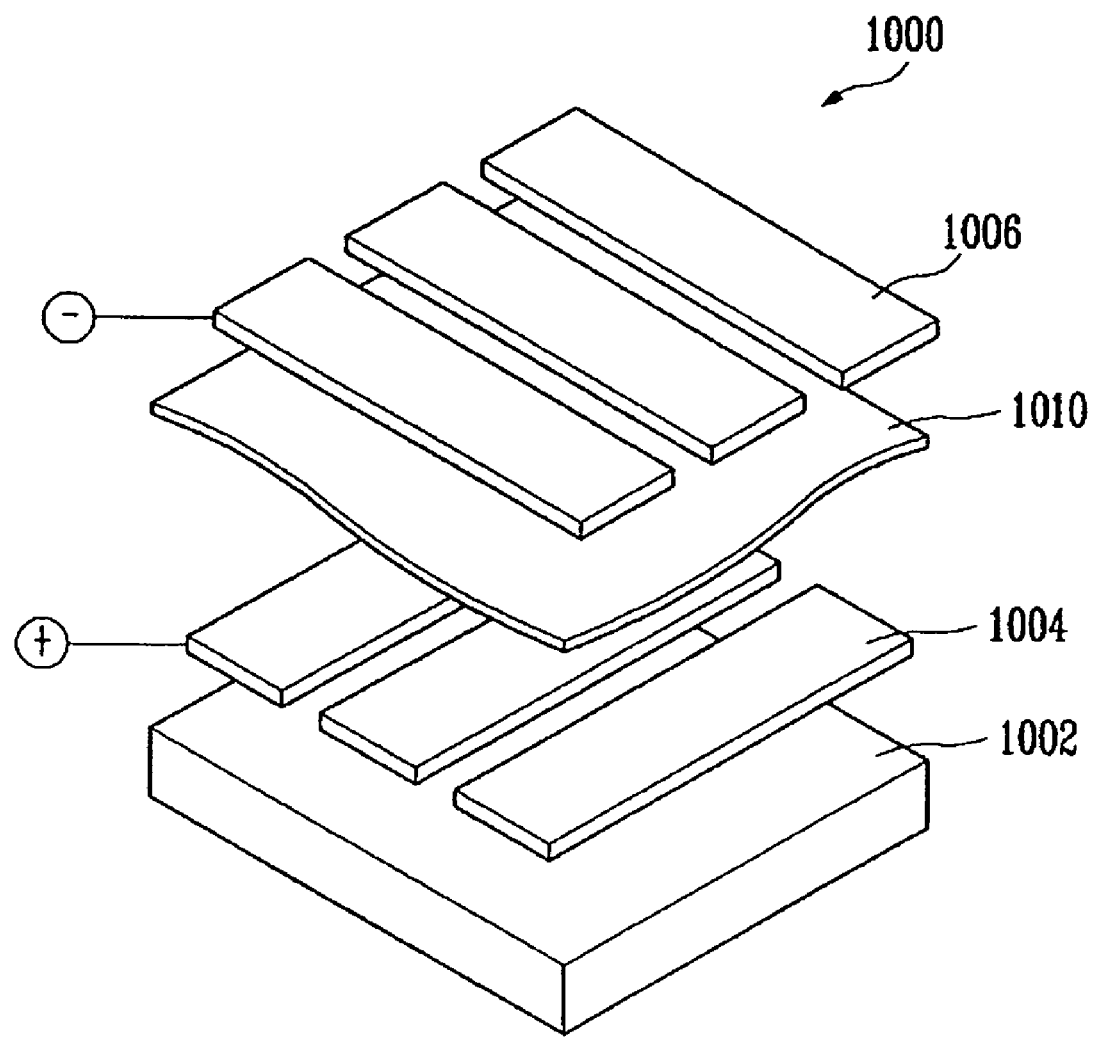
FIG. 7A is a schematic exploded view of a passive matrix type organic light emitting display device in accordance with one embodiment.
Figure 7B:
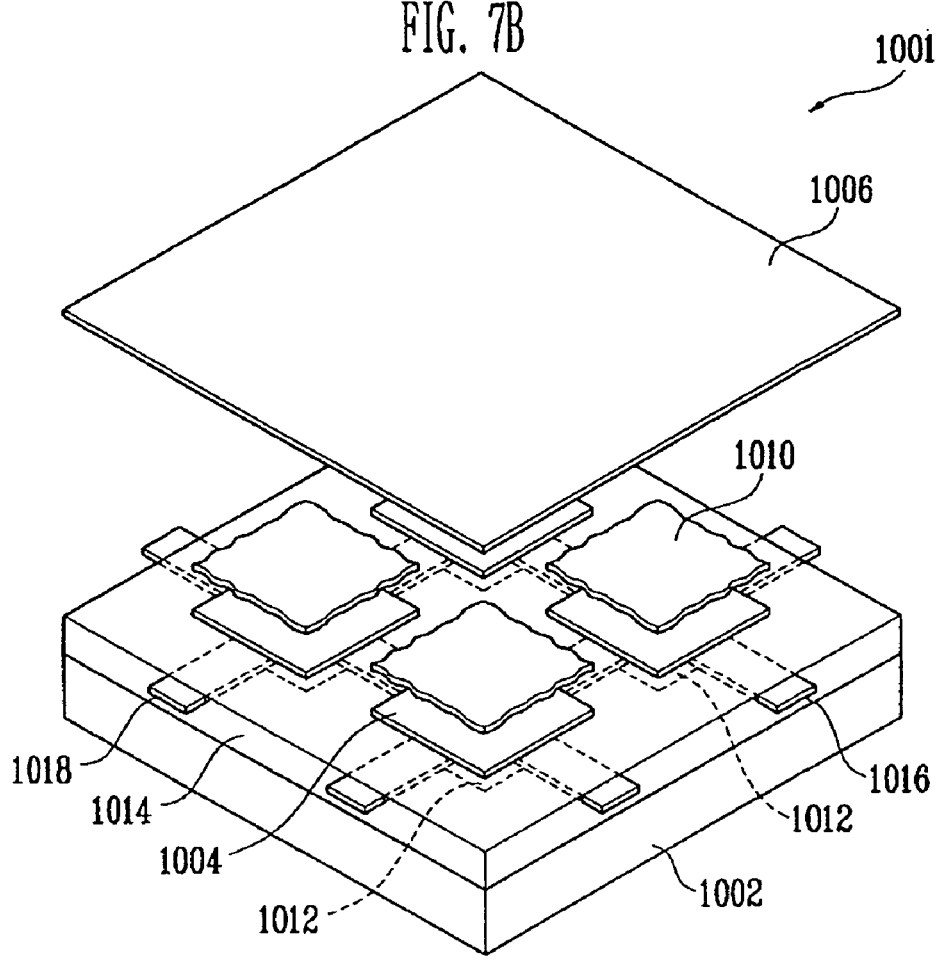
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic fight emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
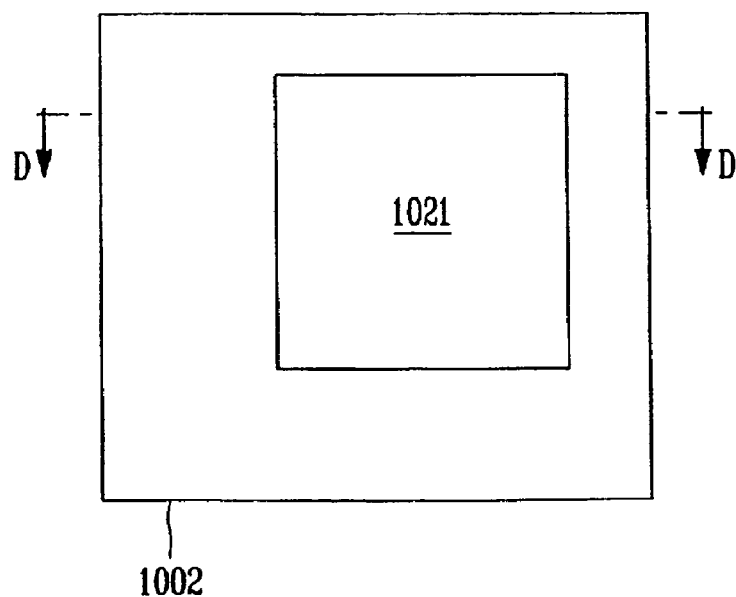
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
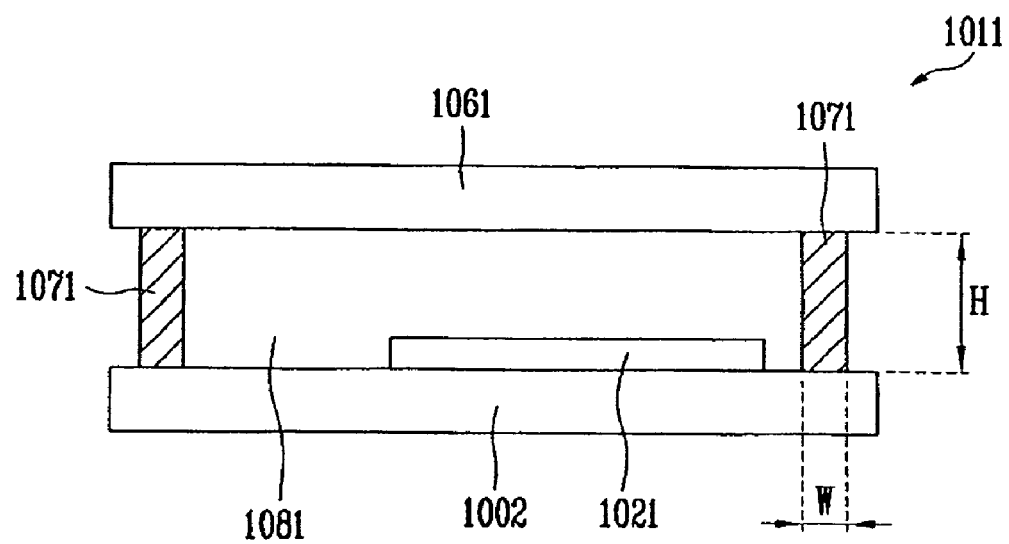
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m²-day and to water of less than $10^{-6}$ g/m²-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally such as from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a fit material or simply "frit" or "glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
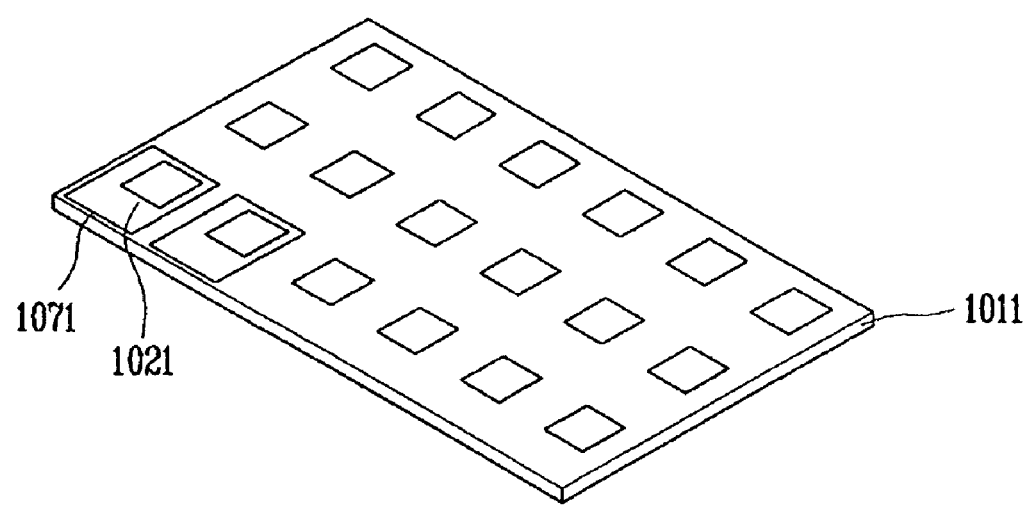
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1:
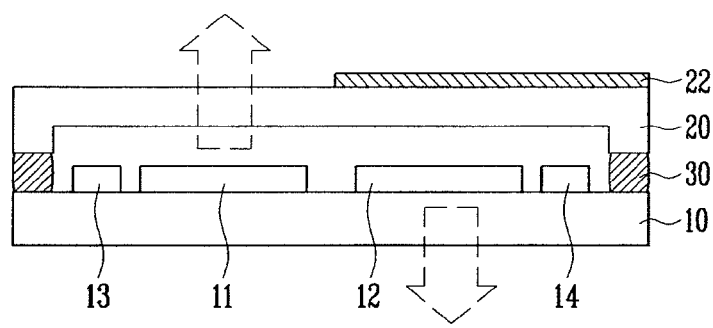
FIG. 1 is a cross-sectional view of a general organic light-emitting display device.

FIG. 1 is a cross-sectional view of an organic light-emitting display device. The display device of FIG. 1 is a dual view type of organic light-emitting display device having two pixel regions emitting light in different directions (e.g., a forward facing display region and a backward facing display region).

Referring to FIG. 1, an organic light-emitting display device is configured including a first substrate 10 and a second substrate 20 positioned to be opposed to each other, and the first and the second substrates 10 and 20 are adhered to each other with encapsulating material 30 and the inner side thereof is thus encapsulated.

The first substrate 10 comprises a first pixel region 11 and a second pixel region 12 and a non-pixel region. The first and the second pixel regions 11 and 12 are provided with a plurality of pixels having at least one organic light-emitting diode (not shown). The non-pixel region is provided with a driving circuit comprising a first scan driver 13 and a second scan driver 14. In this example, the first pixel region 11 is a top emission type pixel region emitting light through the second substrate 20, and the second pixel region 12 is a bottom emission type pixel region emitting light through the first substrate 10. The first scan driver 13 supplies a scan signal to the first pixel region 1, and the second scan driver 14 supplies a scan signal to the second pixel region 12. Thus, the display device shown in FIG. 1 is capable of displaying in two directions, forward and backward in this example.

The second substrate 20 is adhered the first substrate 10 on which the first and the second pixel regions 11 and 12 are formed. The second substrate 20 is adhered to the first substrate 10 such that at least one region of the first substrate 10, in particular, the first and the second pixel regions 11 and 12 is encapsulated between the first substrate 10, the second substrate 20 and the encapsulating material 30. In this example, a light shielding film is formed on an outer side of the second substrate 20 located above the second pixel region 12 for preventing a transmission of external light or light leakage. A black tape, etc. can be used as the light shielding film 22. In other embodiments, where the light shielding film 22 is not provided, a back side of the pixel region 12 facing the second substrate 20 can be made to be opaque.

The encapsulating material 30, such as an epoxy resin, is applied along the edge of the first substrate 10 and the second substrate 20. The encapsulating material is melted, e.g., by irradiation of ultraviolet rays, etc. and is thus cured, adhering the first substrate 10 to the second substrate 20. The encapsulating material 30 is used to prevent the infiltration of oxygen and moisture, etc. into the region between the first substrate 10 and the second substrate 20 containing the first and the second pixel regions 11 and 12.

However, even though the encapsulating material 30 is applied, the infiltration of oxygen and moisture, etc. through fine cracks in the encapsulating material and/or the substrates cannot be completely blocked. In order to prevent this, in the prior art moisture absorbent material (not shown), etc., can be coated on the second substrate 20 and then burned. However, the adhesion between the encapsulating material 30 and the substrates 10 and 20 can be deteriorated due to outgassing generated when the moisture absorbent material is burned, causing a problem that the first and the second pixel regions 11 and 12 are easily exposed to oxygen and moisture.

U.S. Patent Laid-Open Publication No. 2004-0207314 discloses a structure to encapsulate at least one region including the first and the second pixel regions 11 and 12 of the first substrate 10 by applying a frit to a glass substrate without having moisture absorbent material applied. According to this patent publication, since the space between the two substrates is completely encapsulated by curing the melted frit, the moisture absorbent material is not needed and thus the first and the second pixel regions 111 and 12 can be more effectively protected.

Figure 2:
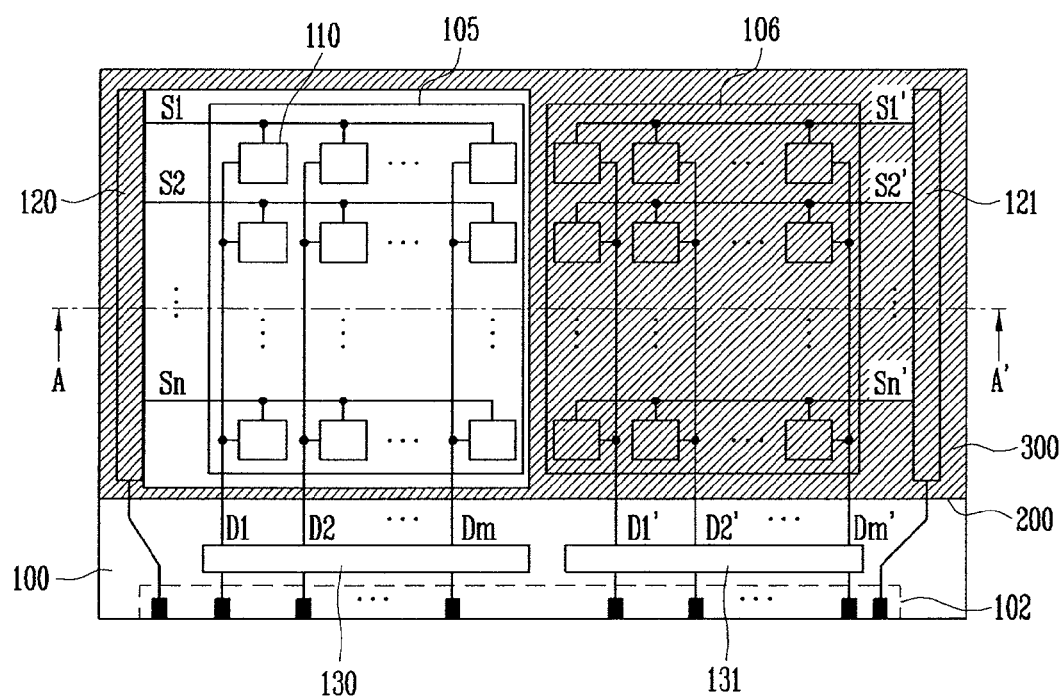
FIG. 2 is a plan view of an organic light-emitting display device according to the embodiment of the present invention.
Figure 3:
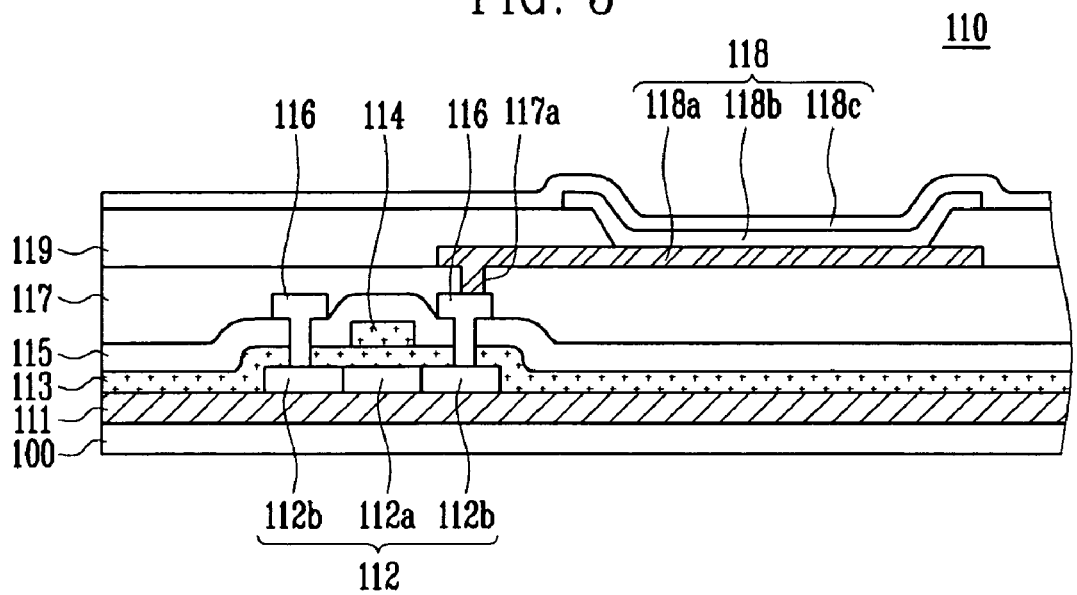
FIG. 3 is a cross-sectional view of main parts of the pixel shown in FIG. 2.

FIG. 2 is a plan view showing an organic light-emitting display device according to an embodiment. FIG. 3 is a cross-sectional view of main parts of a pixel contained in the display device shown in FIG. 2. FIG. 2 shows a double side emission type active matrix organic light-emitting display device. Each pixel is provided with at least one thin film transistor and an organic light-emitting diode, however, the present invention is not limited thereto.

Referring to FIG. 2 and FIG. 3, an organic light-emitting display device, according to an embodiment, comprises: a first substrate 100; a second substrate 200 disposed over the first substrate 100 to be overlapped with at least one region of the first substrate 100. A frit 300 is applied to at least one region between the first substrate 100 and the second substrate 200 and the first and the second substrates 100 and 200 are adhered to each other by means of at least a portion of the applied frit 300.

On the first substrate 100, a first pixel region 105 and a second pixel region 106 each comprise a plurality of pixels 110. A first scan driver 120 and a first data driver 130 for supplying a driving signal to the first pixel region 105 are formed on the substrate 100. A second scan driver 121 and a second data driver 131 for supplying a driving signal to the second pixel region 106 are also formed on the first substrate 100. A pad region 102 comprising a plurality of electrically conductive pads for supplying control signals to the first and the second scan drivers 120 and 121 and to the first and the second data drivers 130 and 131 is formed on the first substrate 100.

The first and the second pixel regions 105 and 106 include at least the regions where scan lines (S1 to Sn and S1' to Sn') arranged in a row direction intersect data lines (D1 to Dm and D1' to Dm') arranged in a column direction. A plurality of pixels 110, positioned at points where the scan lines (S1 to Sn and S1' to Sn') intersect with the data lines (D1 to Dm and D1' to Dm') are formed in the first and second pixel regions 105 and 106. The respective pixels 110 generate light having predetermined brightness corresponding to the scan signal supplied to the scan lines (S1 to Sn and S1' to Sn') and the data signal supplied to the data lines (D1 to Dm and D1' to Dm'). Thereby, a predetermined image (or images) is displayed on the first and the second pixel regions 105 and 106. In this example, the first pixel region 105 is a top emission type pixel region emitting light in the direction of and through the second substrate 200, and the second pixel region 106 is a bottom emission type pixel region emitting light in the opposite direction and through the first substrate 100. That is, the organic light-emitting display device according to the present embodiment provides a double sided emission type organic light-emitting display device. Thus, an image is displayed on the front and the rear thereof. To this end, the first and the second substrate 100 and 200 are made of transparent materials.

Each pixel 110 included in the first and the second pixel region 105 and 106 includes an organic light-emitting diode 118. The light-emitting diode 118 is a light emission element, and at least one thin film transistor is connected to the organic light-emitting diode 118, as shown in FIG. 3. However, the structure of the pixel 110 can be modified in various ways and can be included in an active matrix organic light-emitting display device or a passive matrix organic light-emitting display device.

The thin film transistor comprises a buffer layer 111 formed on the first substrate 100, a semiconductor layer 112 formed on the buffer layer 111 and including a channel region 112a and source and drain regions 112b, a gate insulating film 113 formed on the semiconductor layer 112, a gate electrode 114 formed on the gate insulating film 113, an interlayer insulating film 115 formed on the gate electrode 114, and source and drain electrodes 116 formed on the interlayer insulating film 115 and connected to the source and drain regions 112b.

A planarization film 117 having a via hole 117a exposing at least one region of the drain electrode 116 is formed over the interlayer insulating film 115 and the source and drain electrodes 116. The organic light-emitting diode 118 connected to the thin film transistor through the via hole 117a is formed over the planarization layer 117. The organic light-emitting diode 118 comprises a first electrode 118a, a second electrode 118c, and an organic light-emitting layer 118b positioned therebetween. The first electrode 118a is formed on the planarization film 117 and is connected to the drain electrode of the thin film transistor through the via hole 117a. In the case of a pixel configured to emit light from its top, such as a pixel located in the first pixel region 105, the first electrode 118a can further be provided with a reflective film for improving light efficiency of reflecting light through the second substrate 200. A pixel defining film 119 is formed over the first electrode 118a having an opening portion exposing at least a part of the first electrode 118a. The organic light-emitting layer 118b is formed in the opening portion of the pixel defining film 119. The second electrode 118c is formed over the organic light emitting layer 118b. In the case of the pixel 110 being configured to emit light from the rear thereof, such as in the case of a pixel included in the second pixel region 106, the second electrode 118c can further be provided with a reflective film for improving the efficiency of reflecting the emitted light through the first substrate 100. A passivation layer, as well as other layers, which are not shown, can further be formed over the second electrode 118c. The organic light-emitting diode 118 as described above generates light having predetermined brightness corresponding to the current level supplied from the thin film transistor.

First and second scan drivers 120 and 121, first and second data drivers 130 and 131, and a pad region 102 are formed in a non-pixel region around the first and the second pixel regions 105 and 106. The first and the second scan drivers 120 and 121 generate scan signals corresponding to the control signals supplied from electrically conductive pads (e.g., supplied by an external signal source) in the pad region 102 and supply them to the scan lines (S1 to Sn) of the first pixel region 105 and the scan lines (S1' to Sn') of the second pixel region 106, respectively. The first and the second data drivers 130 and 131 generate data signals corresponding to data and control signals supplied from the electrically conductive pads (e.g., supplied by an external data source) in the pad region 102, and supply them to data lines (D1 to Dm) of the first pixel region 105 and the data lines (D1' to Dm') of the second pixel region 106, respectively. The pad region 102 supplies the control signals supplied from an external source to the first and the second scan drivers 120 and 121 and the first and the second data drivers 130 and 131.

The second substrate 200 positioned over the upper part of the first substrate 100 so as to overlap at least the first and the second pixel regions 105 and 106. The pixels 110 formed on the first substrate 100 include the organic light-emitting layer 118a and therefore can be adversely affected when oxygen and moisture infiltrate the area between the first and second substrates 100 and 200. Therefore, in order to prevent an infiltration of oxygen and moisture into the first and the second pixel regions 105 and 106 in which pixels 110 are formed, the second substrate 200 is adhered to the first substrate by at least a portion of the frit 300 surrounding the first and the second pixel regions 105 and 106. In the embodiment shown in FIG. 2, the second substrate 200 is also configured to encapsulate the first and the second scan drivers 120 and 121, however, the present invention is not limited thereto. That is, the second substrate 200 is positioned over the upper part of the first substrate 100 so as to overlap at least a part of the first substrate 100, including the first and the second pixel regions 105 and 106, and is then adhered to the first substrate 100 by means of at least a portion of the frit 300. As discussed above in reference to FIG. 1, some organic light emitting displays include an opaque layer or a black matrix layer such as the light shielding film 22 formed over a portion of the second substrate 200 located over the second pixel region 106. The light shielding film 22 prevents light emitted from the second pixel region 105 from being emitted through or reflected off of the second substrate 200, where the second pixel region 105 is configured to emit light through the first substrate 100. However, in other embodiments the second substrate 200 may comprise a transparent material. In these other embodiments, the frit 300 is a non-transparent material (e.g., a black tint) and is applied to the inner side of the second substrate 200 facing the second pixel region 106, and therefore the frit 300 functions as an adhesive material as well serving as the black matrix to prevent light emitted from the second pixel from reflecting off of or transmitting through the second substrate 200. Preferably, the frit 300, comprises material including a transition metal, tinted black for preventing light from being passed through or reflecting off of the second substrate 200, thereby functioning as the black matrix (BM) preventing the light leakage.

A frit seal portion of the frit 300 can be applied to portions of the first and the second substrates 100 and 200 and then bonded together in order to completely adhere the first and the second substrates 100 and 200 to each other. Another portion of the frit 300 can be applied to overlap with the inner side of the second substrate in an area facing the second pixel region 106. Accordingly, the inner portion of the fit 300 overlaps with the second pixel region 106, the inner portion functions as a black matrix blocking light generated in the second pixel region 106 not permitting it to be emitted from the second pixel region 106 and transmitted through or reflected off of the second substrate 200. An additional black matrix layer dedicated to blocking light is not needed, thereby, simplifying the process as well as effectively preventing the light leakage. However, since the first pixel region 105 should emit light from the top and through the second substrate 200, the fit 300 is formed so as not to be positioned above the first pixel region 105. By forming the frit seal portion of the fit 300 on the circumferential portion surrounding the first pixel region 105, for example, so as to include the first scan driver 120, light leakage generated from the first pixel region 105 can be effectively blocked from entering into the regions outside of the circumference of the first pixel region 105. That is, the frit 300 is formed to be positioned on the second substrate in regions other that the first pixel region 105 and configured to surround at least the first pixel region 105, thereby effectively preventing light leakage.

The frit 300 can comprise raw glass material and one or more additives in the form of a powder. Alternatively, the frit 300 can be in a solidified state after being melted and then being permitted to solidify. In this example, the frit seal portion of the frit 300 is adhered to the first and the second substrate 100 and 200 so as to completely surround the space including the first and second pixel regions 105 and 106 (and the scan drivers 120 and 121) between the first and the second substrates 100 and 200. The frits seal portions located in the non-pixel region and configured to surround the first and second pixel regions 105 and 106 are melted by laser of infrared rays and are allowed to resolidify, thereby effectively encapsulating the first and second pixel regions in an enclosed space and blocking an infiltration of oxygen and moisture into the enclosed space. However, only the frit seal portion of the frit 300 located in the non-pixel region surrounding the display elements including the second pixel region 105 and 106 and the first and the second scan drivers 120 and 121 is used to adhere the first and the second substrates 100 and 200. A detailed explanation of a method of encapsulating the first and second pixel areas 105 and 106 by applying the frit 300 will be described below in reference to FIGS. 6A to 6D.

Figure 4:
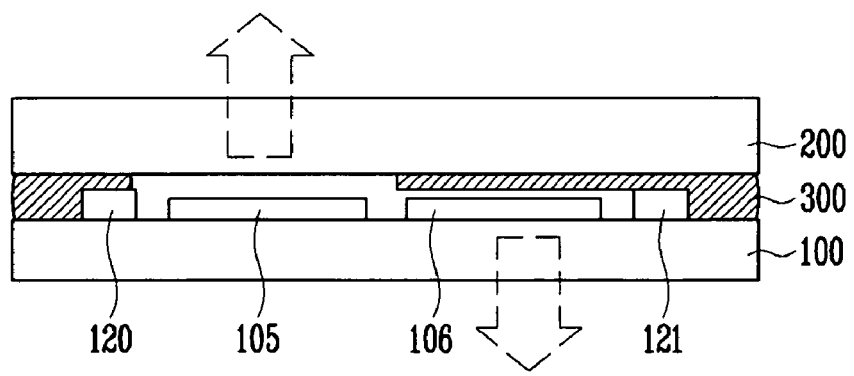
FIG. 4 and FIG. 5 are cross-sectional views of an organic light-emitting display device taken along A-A' line in FIG. 2.

FIG. 4 is a cross-sectional view of an organic light-emitting display device taken along A-A' line in FIG. 2. The first pixel region 105 formed on the fist substrate 100 emits light in the direction of the second substrate 200, and the second pixel region 106 emits light in the opposite direction toward the first substrate 100. The first and the second pixel regions 105 and 106 as discussed above are enclosed in a space defined by the first and second substrates 100 and 200 and the frit 300. Here, the frit 300 comprises a material that is non-transparent to visible light (e.g., tinted with a black color) and is positioned on the inner surface of the second substrate 200 in an area opposing the second pixel region 106, thereby effectively blocking the light leakage. However, a peripheral frit seal portion of the frit 300 is formed to be thicker than the inner frit 300 and is configured to surround both the first and the second pixel regions 105 and 106 (see FIG. 4).

In some embodiments, the frit 300 comprises a glass material, an additive or filler material for adjusting the absorption characteristics, and an additive or filler material for adjusting the thermal expansion coefficient of the frit 300. The frit material can be applied to the second substrate 200 in the form of a paste and subsequently melted, e.g., by laser or infrared rays, and allowed to resolidify between the first and the second substrates 100 and 200, thereby adhering the first substrate 100 to the second substrate 200. During the irradiation process, if laser or infrared rays are irradiated to the frit 300 positioned in areas in proximity of the first and/or the second pixel regions 105 and 106 and the first and the second scan drivers 120 and 121, the internal circuits of the first and the second pixel regions 105 and 106 and the first and the second scan drivers 120 and 121 can be damaged. Therefore, the laser or infrared rays should be irradiated to only the frit 300 applied to the portion of the substrates in which these elements are not formed, e.g., by using a mask, etc. That is, by irradiating laser or infrared rays along the edge of the frit 300 in which the second pixel regions 105 and 106 and the first and the second scan drivers 120 and 121 are not formed, the frit 300 adheres and encapsulates the first and the second substrates 100 and 200. The frit 300 positioned along the edges of the non-pixel region absorbing laser or infrared rays is melted and allowed to resolidify, thereby enclosing the first and second pixel regions 105 and 106 between the first and the second substrates 100 and 200 and the frit 300. However, the frit 300 applied to the region in which the second pixel region and 106 and the first and the second scan drivers 120 and 121 are formed is not irradiated and thereby not adhered to the second pixel region 106 and the first and the second scan drivers 120 and 121 where the frit 300 is not functioning as a source of adhesion but functions only as the black matrix preventing the light leakage.

Figure 5:
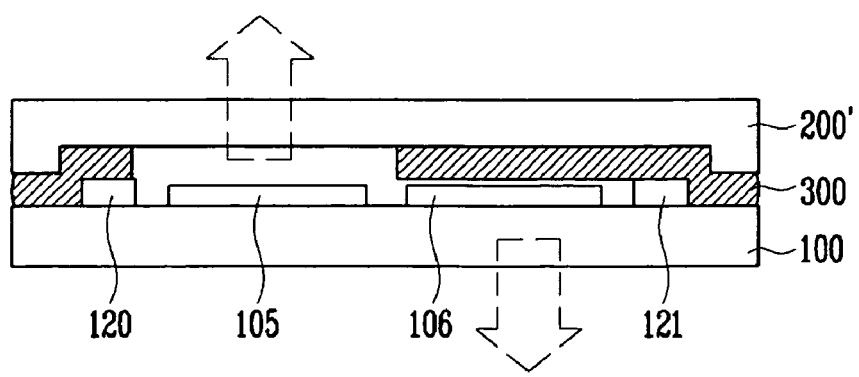

The example shown in FIG. 4 shows the second substrate 200 as a flat panel, however, the second substrate 200 can also include an inner etched portion wherein the thickness of the inner portion is thinner than that of an outer edge portion surrounding the inner etched portion. In this case, the frit 300 can be formed over the entire inner side of the second substrate 200 (except in the portion located across from the first pixel region 105) in the same thickness. For example, the frit seal portion of the frit 300 surrounding the first and second pixel regions 105 and 106 and the first and second scan drivers 120 and 121, and the inner frit portion facing the second pixel region 106 can be formed in the same thickness. FIG. 5 shows a cross sectional view of an organic light-emitting display device including an etched second substrate 200'. Since the etched second substrate 200' has a thinner inner portion in the region across from the pixel region 105 and the scan drivers 120 and 120', the frit 300 can be applied in the same thickness across the second substrate 200'. The outer edge of the frit 300 will then be the only portion bonding the first substrate 100 and the second substrate 200'.

FIG. 6a to FIG. 6d are cross-sectional views showing various stages in a process of fabricating the organic light-emitting display device shown in FIG. 4. Referring to FIG. 6a to FIG. 6d, a method of fabricating the organic light-emitting display device shown in FIG. 4 will be described in detail. For convenience, although FIG. 6a to FIG. 6d show the method for fabricating the individual organic light-emitting display device, in fact a plurality of display device cells can be fabricated in a sheet unit and subsequently cut into individual display devices.

Figure 6A:
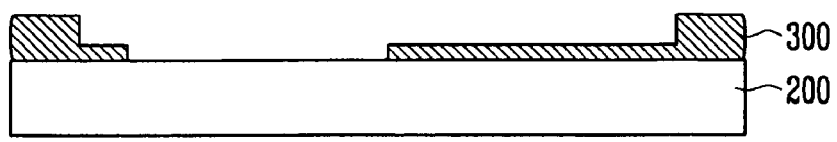
FIG. 6a to FIG. 6d are cross-sectional views showing the fabricating process of the organic light-emitting display device shown in FIG. 4.
Figure 6B:
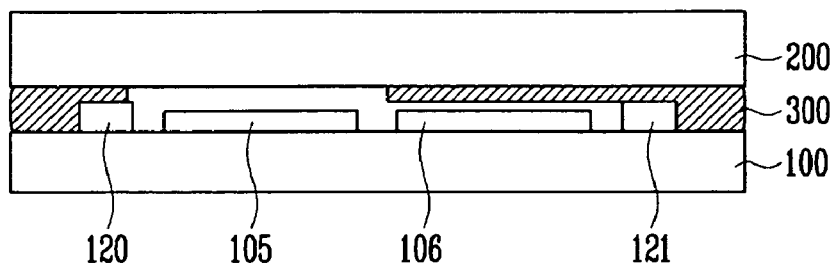

Referring to FIG. 6a, first the frit 300 is applied to the inner side of the second substrate 200 facing the first substrate 100. The frit 300 is applied in an inner portion of the substrate 200 facing the second pixel region 106 and a frit seal portion is formed in the non-pixel region surrounding the first and second pixel regions 105 and 106. A frit layer is not formed on the inner side of the second substrate in the area of the first pixel region 105 in order to allow light emitted from the first pixel region 105 to pass through the second substrate 200. The frit seal portion of the frit 300 in the region surrounding at least one of the non-pixel regions 105 or 106, that is, the edge part in which no display elements are formed, is made to be thicker than the inner portion of the frit 300 to be overlapped with the second pixel region 106 and the first and second scan drivers 120 and 121. The frit 300 is applied to the second substrate 200 in a paste state and may include an additive or filler to adjust the absorption characteristics of the seal for selected frequencies of incident radiant energy including absorbent laser or infrared rays. The paste is then melted and allowed to resolidify after moisture or organic binder material included in the paste is removed. The frit paste can transformed into a gel state by adding oxide powder and organic substance to the glass powder, increasing the temperature of the frit paste 300 preferably to a range from about 300° C. to about 500° C. It is preferable that the thickness of the frit 300 be from about 10 μm to about 20 μm. if the frit seal is about 20 μm or more, a large amount of energy may be required at the time of sealing with laser so that the power of laser needed to melt the frit may be excessively high, or the scan speed of the laser may be excessively slow, resulting in possible heat damage to the frit, the substrates, and/or the display elements. If the frit seal is about 10 μm or less, defects due to unequal deposition of the frit material may occur at an unacceptable rate.

In one embodiment, the first substrate 100 comprising the first and the second pixel regions 105 and 106 and the first and the second scan drivers 120 and 121 is provided as an unfinished product. The unfinished device formed on the first substrate 100 is placed over the second substrate 200. The first substrate 100 and the second substrate 200 are bonded to each other by the frit 300 so that the first and the second pixel regions 105 and 106 are encapsulated in a space defined by the first and second substrates 100 and 200 and the frit 300. At this time, the frit 300 is positioned between the first and the second substrates 100 and 200.

Figure 6C:
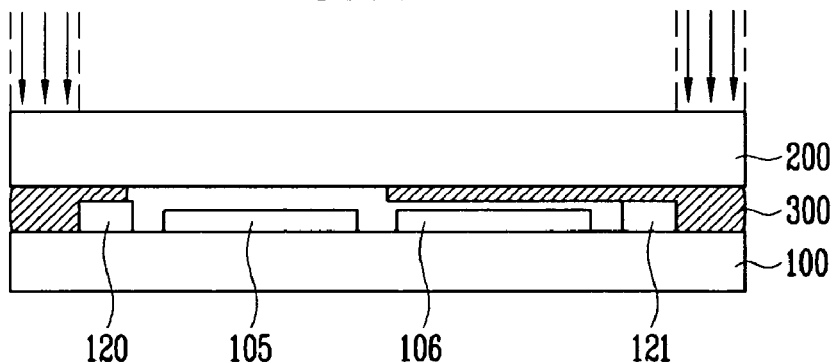
Figure 6D:
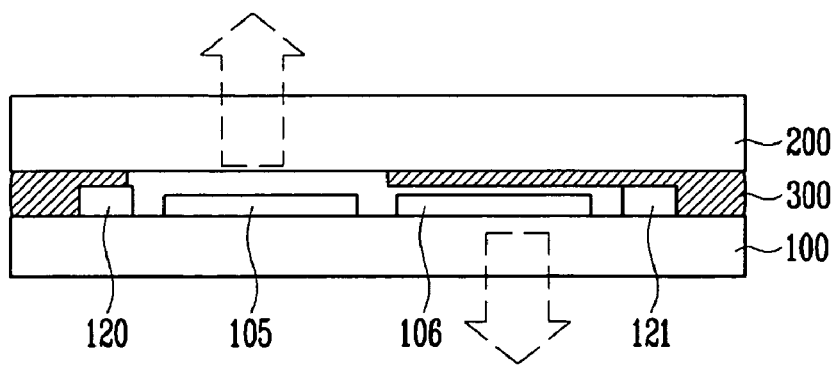

After positioning the first and second substrates as shown in FIG. 5b, laser or infrared rays are irradiated to the frit 300 in the frit seal positioned in the outer region of the substrates in which no elements subject to damage by irradiation are formed, as shown in FIG. 6c. The frit seal portion of the frit 300, to which laser or infrared rays are irradiated, is melted by absorption of the energy in the laser or infrared rays. Preferably, the wavelength of laser or infrared rays is in a range from about 800 nm to about 1200 nm (more preferably, about 810 mm). Preferably, the beam size is configured to be from about 1.0 nm to about 3.0 nm in diameter, and the output electric power is configured to be from about 25 watt to about 45 watt. The portions of the substrates to which laser or infrared rays are not to be irradiated can be masked. That is, the wirings (not shown) positioned between the fist and the second pixel regions 105 and 106 and the first and the second scan drivers 120 and 121 can be masked so as not to be irradiated by laser or infrared rays. In this way, the wirings and the elements that are susceptible to damage by the irradiation may be prevented from being adversely affected by the laser or infrared rays. in one embodiment, a mask comprising a double film of copper and aluminum can be used.

The irradiation of the frit 300 melts the outer frit seal portion surrounding the pixel region 105 containing the array of organic light-emitting pixels. The frit seal is then allowed to resolidify thereby adhering the first substrate 100 to the second substrate 200 with the outer frit seal portion only. The inner frit layer serving as the black mask is substantially unaffected by the irradiation process since it was masked from the irradiation beam.

Although the example process discussed in reference to FIGS. 6a to 6d comprises forming the frit on the second substrate 200, the process is not limited thereto. For example, the frit 300 can first be applied to the first substrate 100 on which the first and the second pixel regions 105 and 106 are formed, or can be applied to both the first and the second substrates 100 and 200, adhering the first and the second substrates 100 and 200. Also, when the second substrate 200 is configured to be an etched glass as shown in FIG. 5, the frit 300 can be applied to the second substrate 200 in the same thickness. This may further simplify the step of forming the frit 300 including the inner portion serving as the black matrix for the second pixel region 106, and the outer portion serving as the frit seal.

In the organic light-emitting display device and the method for fabricating the same as described above, the first and the second substrates 100 and 200 are adhered by means of the frit 300, resulting in that the infiltration of oxygen and moisture, etc. into the internal space including the first and the second pixel regions 105 and 106 can be effectively blocked. Also, in the double side emission type organic light-emitting display device comprising the first pixel region 105 emitting light to the top and the second pixel region 106 emitting light to the rear, the frit 300 tinted black can be formed on an inner side of the second substrate 200 in proximity of the second pixel region 106, and formed in the non-pixel region surrounding the first and second substrates 100 and 200, thereby improving image quality by effectively preventing the light leakage. In this case, since the black matrix of the second pixel region 106 can be formed in the same step as the frit seal for encapsulating the first and the second substrates 100 and 200, there is no need to make the second substrate 200 partially opaque or to form the light shielding film thereon in a second step. Thus, simplifying the fabrication process and reducing the processing time thereof. The regions of the fit located in proximity of the parts in which display elements are formed, such as the first and the second pixel regions 105 and 106 and the first and the second scan drivers 120 and 121, are masked and thus not irradiated by laser or infrared rays. Only the outer frit seal portion of the frit 300 is irradiated by laser or infrared rays, thereby preventing damage to the display elements.

As described above, according to the organic light-emitting display device and the method for fabricating the same, the first and the second substrates are adhered by means of the frit 300, resulting in that the infiltration of oxygen and moisture, etc. into the internal space including the pixel regions can be effectively blocked. Also, in the double side emission type organic light-emitting display device comprising the first pixel region emitting light from the top and the second pixel region emitting light from the rear, the frit tinted black can be formed to be overlapped with the second pixel region and the non-pixel region surrounding the first and second pixel regions, thereby improving image quality by effectively preventing the light leakage. In this case, the black matrix can be formed while forming a frit seal for encapsulating the first and the second substrates, simplifying the process thereof and reducing the process time thereof.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light-emitting device comprising:
    a first substrate;
    a second substrate comprising an inner surface facing the first substrate, the inner surface comprising a first portion and a second portion;
    a first array of light-emitting pixels interposed between the first substrate and the second substrate, said first array configured to emit light in at least a first direction;
    a second array of light-emitting pixels interposed between the first substrate and the second substrate, said second array configured to emit light in at least a second direction;
    a frit layer formed over the first portion of the inner surface while not formed over the second portion of the inner surface so as to block light scattered toward the second direction, wherein the first portion generally opposes the first array and the second portion generally opposes the second array; and
    a frit seal interconnecting the first and second substrates while surrounding the first array and the second array such that the frit seal, the first substrate and the second substrate form an enclosed space where the first array and the second array are located.

2. The device of claim 1, wherein the pixels of the first array are configured to emit light substantially through the first substrate.

3. The device of claim 1, wherein the pixels of the second array are configured to emit light substantially through the second substrate.

4. The device of claim 3, wherein the first portion of the inner surface extends over the entire first array.

5. The device of claim 1, wherein a portion of the frit seal is adhered to the first substrate and the second substrate.

6. The device of claim 1, wherein the frit comprises a glass material, and at least one of a filler material to adjust absorption characteristics, and a filler material to adjust thermal expansion characteristics.

7. The device of claim 1, wherein the first substrate and the second substrate are transparent substrates.

8. The device of claim 1, wherein the frit layer comprises a material that is non-transparent to visible light.

9. The device of claim 1, wherein the first array is enclosed inside a first pixel area consisting of pixels configured to emit light in the first direction, and the second array is enclosed inside a second pixel area consisting of pixels configured to emit light in the second direction.

10. The device of claim 1, wherein the frit layer is a continuous single layer.

11. The device of claim 1, wherein the first substrate comprises a first display area on one side of the device, and the second substrate comprising a second display area on an opposite side of the device.

12. An organic light-emitting device comprising:
    a first substrate;
    a second substrate comprising an inner surface facing the first substrate, the inner surface comprising a first portion and a second portion, wherein a thickness of the second substrate in an inner portion comprising the first portion and the second portion is thinner than in an outer portion surrounding the inner portion;
    a first array of light-emitting pixels interposed between the first substrate and the second substrate, said first array configured to emit light in at least a first direction;
    a second array of light-emitting pixels interposed between the first substrate and the second substrate, said second array configured to emit light in at least a second direction;
    a fit layer formed over the first portion of the inner surface while not formed over the second portion of the inner surface so as to block light scattered toward the second direction, wherein the first portion generally opposes the first array and the second portion generally opposes the second array; and
    a fit seal formed over the outer portion interconnecting the first and second substrates while surrounding the first array and the second array such that the fit seal, the first substrate and the second substrate form an enclosed space where the first array and the second array are located.

13. The device of claim 12, wherein the frit layer formed over the first portion of the inner surface and the fit seal formed over the outer portion have substantially same thickness.

14. The device of claim 12, wherein the first portion of the inner surface extends over the entire first array.

15. A method of making an organic light-emitting device, the method comprising:
    providing an unfinished device comprising a first substrate, wherein a first array of organic light emitting pixels and a second array of light emitting pixels are formed on the first substrate;
    providing a second substrate, wherein the second substrate comprises a surface comprising a first portion and a second portion;
    forming a frit layer over the first portion of the surface of the second substrate while not being formed over the second portion of the surface;
    forming a peripheral fit on around edges of the second substrate;
    placing the second substrate over the unfinished device such that the first substrate, the second substrate, and the peripheral frit form an enclosed space therein, wherein the first array and the second array are located in the enclosed space and the first portion generally extends over the first array and the second portion generally extends over the second array so as to block at least some of light scatter toward the first portion; and
    melting and re-solidifying at least part of the peripheral frit so as to interconnect the unfinished device and the second substrate via the peripheral frit.

16. The method of claim 15, wherein the peripheral frit is thicker than the frit layer formed over the first portion.

17. The method of claim 15, wherein melting the peripheral frit comprises irradiating by laser or infrared rays.

18. The method of claim 17, wherein the wavelength of the laser or the infrared rays are in a range from about 800 nm to about 1200 nm.

19. The method of claim 17, further comprising masking at least the first portion and the second portion while irradiating.

20. The method of claim 15, the method further comprising heating the peripheral frit to a temperature sufficient to cure the peripheral frit, wherein the peripheral frit is applied to at least one of the first substrate and the second substrate in form of a paste comprising a glass material and a filler material to adjust absorption characteristics of laser or infrared rays.

21. The method of claim 20, wherein heating the peripheral frit comprises irradiating with laser or infrared rays.

22. The method of claim 20, wherein the peripheral frit is heated to a temperature in a range from about 300° C. to about 500° C.

23. The method of claim 15, wherein the first portion of the inner surface extends over the entire first array.

* * * * *

UNITED STATES PATENT AND TRADEMARK OFFICE
CERTIFICATE OF CORRECTION

| | |
|---|---|
| PATENT NO. | : 7,919,920 B2 |
| APPLICATION NO. | : 11/644593 |
| DATED | : April 5, 2011 |
| INVENTOR(S) | : Won Kyu Kwak |

It is certified that error appears in the above-identified patent and that said Letters Patent is hereby corrected as shown below:

At Page 1 (Item 57) Abstract, Line 14, Change "fit" to --frit--.

At Column 3, Line 2, Change "fit" to --frit--.

At Column 3, Line 4, Change "fit" to --frit--.

At Column 3, Line 7, Change "fit" to --frit--.

At Column 6, Line 18, Change "fight" to --light--.

At Column 7, Line 47, after "um," delete "optionally".

At Column 8, Line 23, Change "fit" to --frit--.

At Column 10, Line 9, Change "1," to --11,--.

At Column 10, Line 55, Change "111" to --11--.

At Column 13, Line 25, Change "fit" to --frit--.

At Column 13, Line 34, Change "fit" to --frit--.

At Column 13, Line 36, Change "fit" to --frit--.

At Column 15, Line 66-67, Change "810 mm)." to --810 nm).--.

At Column 16, Line 10, Change "rays. in" to --rays. In--.

At Column 16, Line 55, Change "fit" to --frit--.

At Column 17, Lines 20-42, In Claim 1, Change "1. An organic light-emitting device comprising: a first substrate; a second substrate comprising an inner surface facing the first substrate, the inner surface comprising a first portion and a second portion; a first array of light-emitting pixels interposed between the first substrate and the second substrate, said first array configured to emit light in at least a first direction; a second array of light-emitting pixels interposed between the first substrate and the second substrate, said second array configured to emit light in at least a second direction; a frit layer formed over the first portion of the inner surface while not formed over the second portion of the inner surface so as to block light scattered toward the second direction, wherein the first portion Signed and Sealed this
Fifteenth Day of November, 2011

David J. Kappos
*Director of the United States Patent and Trademark Office* generally opposes the first array and the second portion generally opposes the second array; and a frit seal interconnecting the first and second substrates while surrounding the first array and the second array such that the frit seal, the first substrate and the second substrate form an enclosed space where the first array and the second array are located." to --1. An organic light-emitting device comprising: a first substrate; a second substrate comprising an inner surface facing the first substrate, the inner surface comprising a first portion and a second portion; a first array of light-emitting pixels interposed between the first substrate and the second substrate, said first array configured to emit light in a first direction; a first scan driver and a first data driver configured to supply signals to the first array; a second array of light-emitting pixels interposed between the first substrate and the second substrate, said second array configured to emit light in a second direction; and a second scan driver and a second data driver configured to supply signals to the second array; a frit layer formed over the entire first portion of the inner surface and over the first and second scan drivers, while not formed over the second portion of the inner surface so as to block light scattered toward the second direction, wherein the first portion substantially entirely lies over the first array and the second portion substantially entirely lies over the second array, wherein the frit layer comprises a frit seal extending from the frit layer; wherein the frit seal interconnects the first and second substrates while surrounding the first array and the second array such that the frit seal, the first substrate and the second substrate form an enclosed space where the first array and the second array are located.--.

At Column 18, Lines 5-32, In Claim 12, Change "12. An organic light-emitting device comprising: a first substrate; a second substrate comprising an inner surface facing the first substrate, the inner surface comprising a first portion and a second portion, wherein a thickness of the second substrate in an inner portion comprising the first portion and the second portion is thinner than in an outer portion surrounding the inner portion; a first array of light-emitting pixels interposed between the first substrate and the second substrate, said first array configured to emit light in at least a first direction; a second array of light-emitting pixels interposed between the first substrate and the second substrate, said second array configured to emit light in at least a second direction; a fit layer formed over the first portion of the inner surface while not formed over the second portion of the inner surface so as to block light scattered toward the second direction, wherein the first portion generally opposes the first array and the second portion generally opposes the second array; and a fit seal formed over the outer portion interconnecting the first and second substrates while sui rounding the first array and the second array such that the fit seal, the first substrate and the second substrate form an enclosed space where the first array and the second array are located." to --12. An organic light-emitting device comprising: a first substrate; a second substrate comprising an inner surface facing the first substrate, the inner surface comprising a first portion and a second portion, wherein a thickness of the second substrate in an inner portion comprising the first portion and the second portion is thinner than in an outer portion surrounding the inner portion; a first array of light-emitting pixels interposed between the first substrate and the second substrate, said first array configured to emit light in a first direction; a first scan driver and a first data driver configured to supply signals to the first array; a second array of light-emitting pixels interposed between the first substrate and the second substrate, said second array configured to emit light in a second direction; a second scan driver and a second data driver configured to supply signals to the second array; a frit layer formed over the entire first portion of the inner surface and over the first and second scan drivers, while not formed over the second portion of the inner surface so as to block light scattered toward the second direction, wherein the first portion substantially entirely lies over the first array and the second portion substantially entirely lies over the second array, wherein the frit layer comprises a frit seal extending from the frit layer; wherein the frit seal is formed over the outer portion and interconnects the first and second substrates while surrounding the first array and the second array such that the frit seal, the first substrate and the second substrate form an enclosed space where the first array and the second array are located.--.

At Column 18, Line 34, In Claim 13, Change "fit" to --frit--.

At Column 18, Lines 39-63, In Claim 15, Change "15. A method of making an organic light-emitting device, the method comprising: providing an unfinished device comprising a first substrate, wherein a first array of organic light emitting pixels and a second array of light emitting pixels are formed on the first substrate; providing a second substrate, wherein the second substrate comprises a surface comprising a first portion and a second portion; forming a frit layer over the first portion of the surface of the second substrate while not being formed over the second portion of the surface; forming a peripheral fit on around edges of the second substrate; placing the second substrate over the unfinished device such that the first substrate, the second substrate, and the peripheral frit form an enclosed space therein, wherein the first array and the second array are located in the enclosed space and the first portion generally extends over the first array and the second portion generally extends over the second array so as to block at least some of light scatter toward the first portion, and melting and re-solidifying at least part of the peripheral frit so as to interconnect the unfinished device and the second substrate via the peripheral frit." to --15. A method of making an organic light-emitting device the method comprising: providing an unfinished device comprising a first substrate, a first array of organic light-emitting pixels formed on the first substrate, a second array of organic light-emitting pixels formed on the second substrate, a first scan driver and a first data driver configured to supply signals to the first array, and a second scan driver and a second data driver configured to supply signals to the second array, wherein the first array emits light in a first direction and the second array emits light in a second direction; providing a second substrate, wherein the second substrate comprises a surface comprising a first portion and a second portion; forming a frit layer over the entire first portion of the surface of the second substrate and over the first and second scan drivers, while not being formed over the second portion of the surface, wherein the frit layer comprises a peripheral frit seal extending from the frit layer;

forming the peripheral frit seal on edges of the second substrate; placing the second substrate over the unfinished device such that the first substrate, the second substrate, and the peripheral frit form an enclosed space therein, wherein the first array and the second array are located in the enclosed space and the first portion substantially entirely extends over the first array and the second portion substantially entirely extends over the second array so as to block at least some of light scatter toward the first portion; and melting and re-solidifying at least part of the peripheral frit so as to interconnect the unfinished device and the second substrate via the peripheral frit.--.